United States Patent [19]

Epworth et al.

[11] Patent Number: 5,737,459

[45] Date of Patent: Apr. 7, 1998

[54] LOSS INTERFEROMETRIC POWER COMBINER COMPRISING A FEEDBACK CIRCUIT

[75] Inventors: Richard Edward Epworth, Sawbridgeworth; Jonathan Paul King, Epping, both of United Kingdom

[73] Assignee: Northern Telecom Limited, Montreal, Canada

[21] Appl. No.: 528,640

[22] Filed: Sep. 14, 1995

[30] Foreign Application Priority Data

Sep. 27, 1994 [GB] United Kingdom ................ 9419454

[51] Int. Cl.⁶ ............................................. G02B 6/26
[52] U.S. Cl. ........................................ 385/15; 385/42
[58] Field of Search ............................. 385/14–15, 39, 385/48, 27, 42

[56] References Cited

U.S. PATENT DOCUMENTS

| | | | |
|---|---|---|---|
| 3,857,636 | 12/1974 | Angelbeck | 356/106 R |
| 4,552,457 | 11/1985 | Giallorenzi et al. | 356/345 |
| 4,853,935 | 8/1989 | Laine et al. | 372/32 |
| 4,873,989 | 10/1989 | Einzig | 128/692 |
| 4,977,546 | 12/1990 | Flatley et al. | 367/140 |
| 5,104,222 | 4/1992 | Kersey et al. | 356/345 |
| 5,136,600 | 8/1992 | Fidric et al. | 385/15 |
| 5,178,153 | 1/1993 | Einzig | 128/692 |
| 5,253,104 | 10/1993 | Delavaux | 359/341 |
| 5,381,230 | 1/1995 | Blake et al. | 385/14 |
| 5,422,752 | 6/1995 | Hardcastle | 359/183 |
| 5,428,700 | 6/1995 | Hall | 372/32 |
| 5,506,723 | 4/1996 | Junginger | 359/341 |

OTHER PUBLICATIONS

"Polarising Fibre couplec with High Extinction Ratio"; Yokohama et al.; Electronics Letters 22nd Nov. 1984, vol. 20 No.24.

Primary Examiner—John D. Lee
Assistant Examiner—Ellen Eunjoo Kang
Attorney, Agent, or Firm—Lee, Mann, Smith, McWilliams, Sweeney & Ohlson

[57] ABSTRACT

An interferometric optical multiplexer 10 for use in optical communication systems and especially for use in optical communication systems employing fibre optical amplifiers is disclosed. The interferometric optical multiplexer has two input ports 12, 14, an output port 16 and an output monitoring port 18. The interaction of the input signals is monitored by a photodetector situated in the monitoring part 18. In conjunction with a feedback circuit 24 wavelength separation of signals input at pods 12, 14 is ensured.

16 Claims, 1 Drawing Sheet

LOSS INTERFEROMETRIC POWER COMBINER COMPRISING A FEEDBACK CIRCUIT

FIELD OF INVENTION

This invention relates to interferometric multiplexers and in particular relates to multiplexers suitable for use with optically pumped optical amplifiers.

BACKGROUND ART

There are several forms of optical multiplexers or optical fibre couplers available. A first form is the polished half coupler which comprises two curved fibre portions from each of which a part of the cladding is removed. The bared fibre portions are etched or cleaved, polished and aligned in abutting relationship in a potting compound. This type of coupler is expensive and awkward to manufacture. A second form of coupler is the fused fibre coupler which is formed from two or more fibres which are progressively stretched whilst being heated in side by side contact. A third form of coupler is a diffraction grating based multiplexer. Other types of coupler using beam splitters are known but these couplers are large and can be difficult to package.

The polished half coupler is not particularly efficient since 3dB is coupled from each fibre to the other fibre. Accordingly half couplers are not used in optically pumped optical amplifiers. Fused fibre couplers generally operate with the input wavelengths separated by at least the wavelength response band of the coupler or otherwise each pump signal will be coupled to the fibre of the other pump signal. The wavelength response band can be reduced by a technique known as overcoupling or overpulling the fibres but this results in long multiplexers which are difficult to package and, furthermore, are susceptible to noise since the spot size diameter of a signal can exceed the diameter of the fibre. Further problems occur with a narrow wavelength response band due to an interaction of the polarisation states of the input beams. Grating based multiplexers suffer from a temperature dependency and require a good angular resolution to split a broad band source. In an optically pumped optical amplifier, it is frequently desirable to maximise the amount of light with which the amplifier is optically pumped. Optical fibre amplifiers comprise a fibre doped with an ion which is susceptible of producing stimulated emission. A signal beam which is required to be amplified and which operates at a wavelength corresponding to a lasing or stimulated transition wavelength of the amplifier is input to the amplifier together with one or more pump signals. The pump signals excite or invert the doped ions to higher energy levels and are subsequently stimulated by the signal beam to de-excite and to emit a photon at the wavelength of the input beam in the process. Thus, a signal beam which is injected at a first end of the fibre amplifier will be amplified as its passes through the fibre and will provide light coherent with the signal to be amplified. Where there are several pumps, to maximise the overall pumping efficiency of the pumps the wavelengths should be as close to the signal wavelength as possible to maximise overall pumping efficiency.

Typically, an amplifier is pumped in a waveband which is determined by the transmission windows of the fibre carrier and the absorption window of the dopant. Silica fibres have a transmission window from about 500 –1700nm which has several peaks. Fluoro-zirconate host fibres are also used for some amplifiers e.g. praseodymium doped optical amplifiers, and have different transmission windows.

The Erbium ions of Erbium doped optical amplifiers have several absorption windows in which they efficiently utilise the pumped optical power; two of these windows lie about 980 nm and 1470 nm. Although the 1 470 nm absorption window is widely used by reason of it corresponding with a peak in the silicon transmission window, the Erbium absorption window at 980 nm has been found to exhibit intrinsically better population inversion. Furthermore this 980 nm window has the advantage of being suitable for semiconductor laser pumping and has been found to give a good amplifier noise figure. On the debit side the 980 nm window is only 5 nm wide and accordingly the pump lasers need to be closely spaced in wavelength—less than 1 nm for efficient combination. Multiple pumping in the 980 absorption window has therefore not been widely used since it cannot be conveniently pumped by the types of couplers described above.

The Mach-Zehnder Interferometer has been known to provide a useful form of coupler, but in conjunction with certain narrow band amplifiers, e.g. Erbium doped amplifiers, has not been particularly applicable. This inapplicability has been a result of the difficulty in controlling the separation of wavelength between the input lasers. If the lasers are not sufficiently spaced apart in wavelength, then destructive interference can occur at the output of the Interferometer. Problems also arise due to wavelength drift of the lasers and changes in temperature can degrade the performance of the interferometer by changing the path length of the arms.

The present invention seeks to overcome the problems encountered with interferometric multiplexers and to provide a wavelength division multiplexer (WDM) which allows sub-nanometer combining.

SUMMARY OF THE INVENTION

In accordance with the invention there is provided an interferometric optical coupler comprising first and second input ports, an output port and an output monitoring port, wherein first and second lasers are coupled to respective input ports and a photo-detector coupled to the monitoring port comprises part of a feedback circuit, wherein each laser operates in a dither fashion about a centre frequency and wherein the feedback circuit is operable to control the centre frequency of both lasers. This enables two lasers with a small wavelength separation to be multiplexed. By ensuring that the output of the lasers are different but are separated only by a narrow waveband, efficient coupling of the laser outputs can be provided in a simple system.

Preferably both lasers have wavelength control means effected by a variation of the operating temperature of each laser. By dithering the output of the laser about a centre frequency, the laser output can be regulated. The dither frequency can be of the order of a few megahertz and this dither frequency needs to be greater than amplifier response frequency cut-off. This frequency dither is preferably optically discriminated by the feedback circuit.

By including in the feedback circuit a phase-detector, phase discrimination can be effected to provide a feedback signal for frequency tracking. This phase-detector can comprise a multiplier and an integrator, wherein signals from the photo-detector and a laser control circuit can be input to the multiplier which can then output to an integrator to provide a feedback signal for the frequency control circuit. Alternatively, the phase-detector can comprise a multiplier and a comparator wherein signals from the photo-detector and from a laser control circuit are input to the multiplier which can output to a first input of the comparator and wherein the comparator can provide a feedback signal for the frequency control circuit.

The photo-detector can be shared between the lasers and each laser have a feedback loop wherein the single photo-detector is part of each feedback loop.

The interferometric optical coupler can be adapted to be used in a fibre optical multiplexer, with the multiplexer comprising two pump sources coupled to respective input ports of the multiplexer, the multiplexer having a monitoring port coupled to a feedback circuit arranged to control the wavelengths of the pump sources with respect to the multiplexer's optical characteristics so that substantially all the pump power from the sources emerge from an output port of the multiplexer.

There is also provided a method of coupling optical signals using an interferometric optical coupler comprising first and second input ports, an output port and an output monitoring port including a photo detector which comprises part of a feedback circuit; the method comprising the steps of: operating first and second lasers coupled to respective input ports in a dither fashion about respective centre frequencies; and optically discriminating the frequency dither acting on the output of each laser; and controlling the centre frequency of both lasers by means of the feedback circuit.

BRIEF DESCRIPTION OF THE DRAWINGS

In order to provide a greater understanding of the invention, reference will now be made to the figures of the accompanying drawing sheet wherein.

DETAILED DESCRIPTION OF THE PREFERRED EMBODIMENTS

Figure 1:
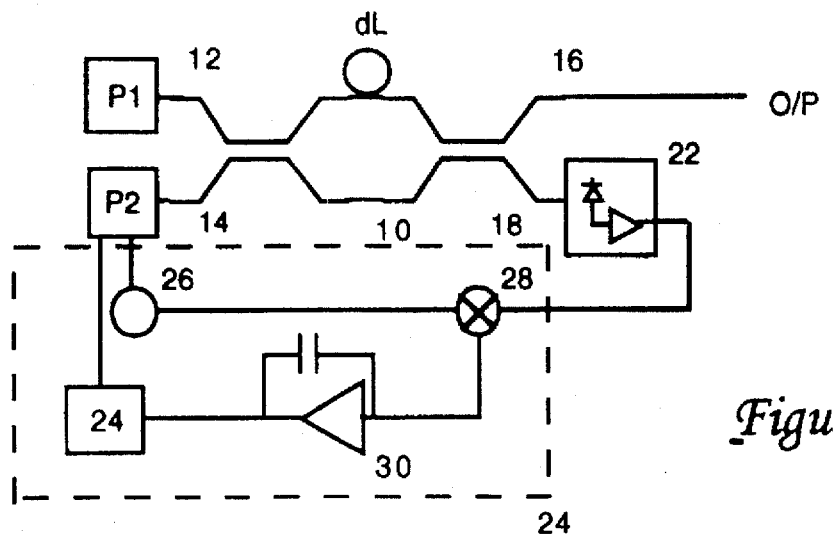
FIG. 1 depicts a first embodiment of the invention.

Referring now to FIG. 1 there is shown an optical multiplexer employing a Mach-Zehnder interferometer 10 with semi-conductor laser light sources P1, P2 at input ports 12, 14. The path length of the arms of the interferometer 10 differ by way of the introduction of path length difference dL on one arm This path length difference determines the required characteristics of the interferometer. The Mach-Zehnder interferometer 10 is configured such that substantially all of the input light is transferred through output port 16 whilst a small output loss at a monitor or second output port 18 is utilised by photo-detector 22. In this figure only one detector-laser control path is shown and comprises a wavelength control unit 24, a laser power supply 26, a multiplier 28 and an integrator 30. The laser power supply 26 emits a control signal which is multiplied with an output from the photo detector 22. The input laser P2 has a low level control tone which causes the output frequency of the laser to dither about a particular frequency (centre frequency), preferably at a few megahertz which is beyond the high frequency cut off of the amplifier gain response.

The frequency dither acting on the output of both lasers is optically discriminated (frequency to amplitude) by the transfer function of the Mach-Zehnder interferometer. If the wavelength of laser P2 is too close to the wavelength of laser P1 then the feedback wavelength control circuit of laser P2 can operate the wavelength control mechanism to ensure that the laser outputs emerge from the output port 16 without attenuation due to destructive interference. Typically the wavelength control mechanism comprises a temperature control circuit. The temperature control circuit can cool or heat up the laser to effect a change in the output wavelength.

Preferably both lasers are each equipped with a wavelength control circuit with different dither frequencies.

The mechanism of the control circuit is as follows:

If the laser wavelength is too low, the discriminated tone will be (for example) out of phase with the reference control tone; conversely if the laser wavelength is too high, the discriminated tone will be in phase. By performing a phase detection process on the discrimination control tone a feedback signal for wavelength tracking is provided. As shown in FIG. 1 the output from the photo-detector 22 is multiplied by the reference tone, which—depending on the relative phase—will give a positive or negative d.c. output. Integrating the dc output provides a feedback signal for the laser wavelength control circuit 24. In FIG. 1 only the control circuit 24 is shown for laser 2. Laser 1 could share the same photo-detector, but have its own control tone generator and control loop electronics. Feedback loop 36, as shown in FIG. 3, provides a signal for the photo-detector 22 to laser P1.

Figure 2:
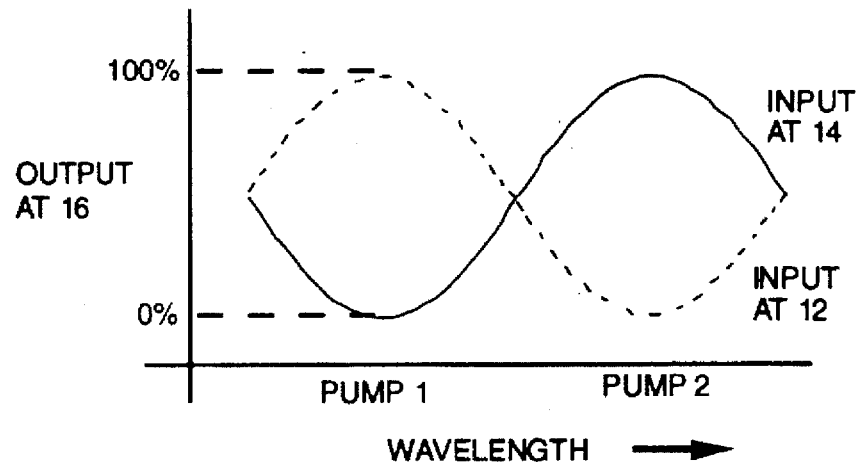
FIG. 2 details the transfer characteristics of a Mach-Zehnder interferometer.

In a typical example, a Mach-Zehnder interferometer with a 2 mm path difference operating at 980 nm would have 0.32 nm separation between adjacent peaks. Accordingly, the input lasers would need to be operating at wavelengths at least 0.16 nm apart. Approximately, over a temperature range of 100 degrees C, the absolute centre wavelength of a specific peak of the Mach-Zehnder characteristic (see FIG. 2) would change by a fraction of $\Delta T.\lambda$. At 980 nm this corresponds to an 0.5 nm change in centre wavelength, that is the pump centre wavelength would need to be tuned over this range to track the Mach-Zehnder operating characteristic. This is a small wavelength change compared to the pump band of a typical Er-doped fibre in an optical fibre amplifier. Thus, the potential advantage of loose stabilisation of the input wavelengths within the pumping band can be achieved.

Figure 3:
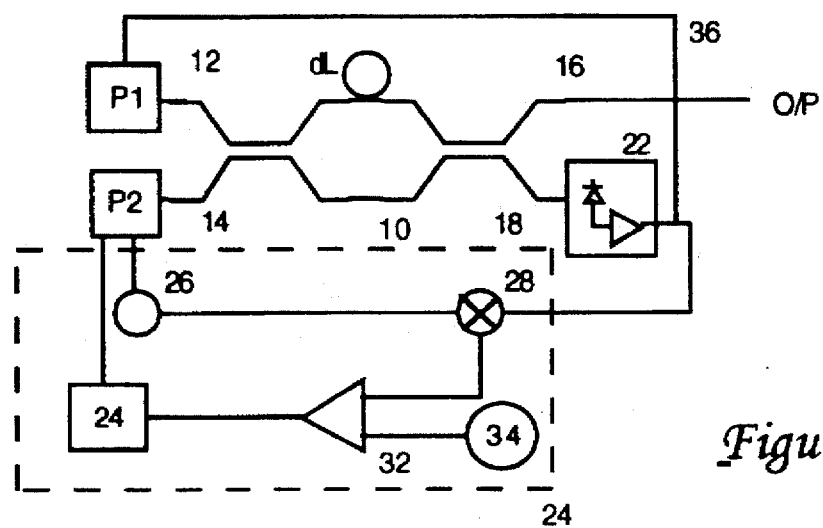
FIG. 3 depicts a second embodiment of the invention.

With reference to FIG. 3, an alternative control circuit is shown which allows the power of each laser P1, P2 to be controlled between the two output ports. This is accomplished by replacing the integrating stage 30 with a comparator or differential amplifier 32. The comparator 32 compares the multiplied signal with a reference signal 34. The reference signal could be set at a particular level to give a fixed input power into one of the arms, (i.e. an automatic power control scheme which would not rely on controlling the drive current to the lasers). This would be carried out in conjunction with an external circuit, for instance, from a monitor of a subsequent output from the amplifier being pumped whereby a feedback mechanism is provided to give gain control of the amplifier.

In a system according to the invention the control scheme for each input laser can operate completely independently so that laser 1 could be running full power with laser 2 switched off or set to a low output power. The power contribution from each laser can be smoothly varied between the two by varying their drive currents, and substantially all their combined power can emerge from the same output port, giving a laser redundancy option.

What is claimed is:

1. An interferometric optical coupler comprising first and second input ports, an output port and an output monitoring port, wherein first and second lasers are coupled to respective input ports and a photo detector comprises part of a feedback circuit, wherein each laser operates in a dither fashion about a centre frequency and wherein the feedback circuit is operable to control the centre frequency of both lasers.

2. A coupler according to claim 1 wherein the dither frequencies of the lasers are of the order of megahertz, whereby the frequency dither can be optically discriminated.

3. A coupler according to claim 1 wherein the feedback circuit further includes a phase detector whereby phase discrimination can be effected to provide a feedback signal for frequency tracking.

4. A coupler according to claim 3 wherein the phase detector comprises a multiplier and an integrator, wherein signals from the photo detector and a laser control circuit are input to the multiplier which outputs to an integrator, wherein the integrator provides a feedback signal for the frequency control circuit.

5. A coupler according to claim 3 wherein the phase detector comprises a multiplier and a comparator wherein signals from the photo-detector and from a laser control circuit are input to the multiplier which outputs to a first input of a comparator and wherein the comparator provides a feedback signal for the frequency control circuit.

6. A coupler according to claim 1 wherein the photo-detector is shared between the lasers and each laser has a feedback loop wherein the single photo-detector is part of each feedback loop.

7. An interferometric optical coupler according to claim 1 adapted to be used in a fibre optical amplifier.

8. A fibre optical amplifier including a pump circuit employing an interferometer as claimed in claim 1.

9. An interferometric multiplexer comprising two pump sources coupled to respective input ports of the multiplexer, the multiplexer having a monitoring port coupled to a feedback circuit arranged to control the wavelengths of the pump sources with respect to the multiplexer's optical characteristics so that substantially all the pump power from the sources emerge from an output port of the multiplexer.

10. A method of coupling optical signals using an interferometric optical coupler comprising first and second input ports, an output port and an output monitoring port including a photo detector which comprises part of a feedback circuit; the method comprising the steps of: operating first and second lasers coupled to respective input ports in a dither fashion about respective centre frequencies; and optically discriminating the frequency dither acting on the output of each laser; and controlling the centre frequency of both lasers by means of the feedback circuit.

11. An interferometric optical coupler comprising first and second input ports, an output port and an output monitoring port, wherein first and second lasers are coupled to respective input ports and a photo detector comprises part of a feedback circuit, wherein each laser operates in a dither fashion about a centre frequency and wherein the feedback circuit is operable to control the centre frequency of both lasers; wherein the feedback circuit further includes a phase detector whereby phase discrimination can be effected to provide a feedback signal for frequency tracking; wherein the phase detector comprises a multiplier and an integrator, wherein signals from the photo detector and a laser control circuit are input to the multiplier which outputs to an integrator, wherein the integrator provides a feedback signal for the frequency control circuit.

12. A coupler according to claim 11 wherein the dither frequencies of the lasers are of the order of megahertz, whereby the frequency dither can be optically discriminated.

13. A coupler according to claim 11 wherein the phase detector comprises a multiplier and a comparator wherein signals from the photo-detector and from a laser control circuit are input to the multiplier which outputs to a first input of a comparator and wherein the comparator provides a feedback signal for the frequency control circuit.

14. A coupler according to claim 11 wherein the photo detector is shared between the lasers and each laser has a feedback loop wherein the single photo-detector is part of each feedback loop.

15. An interferometric optical coupler according to claim 11 adapted to be used in a fibre optical amplifier.

16. A fibre optical amplifier including a pump circuit employing an interferometer as claimed in claim 11.

* * * * *